(12) United States Patent
Lenchenkov et al.

(10) Patent No.: US 8,890,221 B2
(45) Date of Patent: Nov. 18, 2014

(54) BACKSIDE ILLUMINATED IMAGE SENSOR PIXELS WITH DARK FIELD MICROLENSES

(71) Applicant: Aptina Imaging Corporation, George Town (KY)

(72) Inventors: Victor Lenchenkov, Sunnyvale, CA (US); Xianmin Yi, Menlo Park, CA (US)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 14/031,804

(22) Filed: Sep. 19, 2013

(65) Prior Publication Data

US 2014/0085517 A1 Mar. 27, 2014

Related U.S. Application Data

(60) Provisional application No. 61/703,997, filed on Sep. 21, 2012.

(51) Int. Cl.

| | |
|---|---|
| *H01L 31/062* | (2012.01) |
| *H01L 31/113* | (2006.01) |
| *H01L 21/00* | (2006.01) |
| *H04N 5/335* | (2011.01) |
| *H01L 27/146* | (2006.01) |

(52) U.S. Cl.
CPC .......... *H01L 27/14627* (2013.01); *H04N 5/335* (2013.01); *H01L 27/14685* (2013.01); *H01L 27/14629* (2013.01); *H01L 27/14643* (2013.01); *H01L 27/14623* (2013.01); *H01L 27/14683* (2013.01); *H01L 27/1464* (2013.01)
USPC .............................................. 257/294; 438/69

(58) Field of Classification Search
CPC .................. H01L 27/14627; H01L 27/24623; H01L 27/14643; H01L 27/14683; H01L 14/271464

USPC ................................. 257/294; 438/29, 65, 69
See application file for complete search history.

(56) References Cited

U.S. PATENT DOCUMENTS

| | | | |
|---|---|---|---|
| 7,064,405 B2 | 6/2006 | Kondo et al. | |
| 7,443,005 B2* | 10/2008 | Kuo et al. ..................... | 257/432 |
| 7,560,295 B2* | 7/2009 | Boettiger et al. ............... | 438/22 |
| 7,670,868 B2 | 3/2010 | Im | |
| 7,973,347 B2 | 7/2011 | Im | |
| 8,119,436 B2* | 2/2012 | Park ............................... | 438/69 |
| 8,704,935 B2* | 4/2014 | Boettiger ....................... | 348/340 |
| 8,772,892 B2* | 7/2014 | Okigawa ........................ | 257/432 |
| 2012/0194714 A1* | 8/2012 | Yamashita .................... | 348/294 |

* cited by examiner

*Primary Examiner* — William D Coleman
(74) *Attorney, Agent, or Firm* — Treyz Law Group; Jason Tsai

(57) ABSTRACT

A backside illuminated image sensor with an array of image sensor pixels is provided. Each image pixel may include a photodiode and associated pixel circuits formed in a front surface of a semiconductor substrate. Silicon inner microlenses may be formed on a back surface of the semiconductor substrate. In particular, positive inner microlenses may be formed over the photodiodes, whereas negative inner microlenses may be formed over the associated pixel circuits. Buried light shielding structures may be formed over the negative inner microlenses to prevent pixel circuitry that is formed in the substrate between two neighboring photodiodes from being exposed to incoming light. The buried light shielding structures may be lined with absorptive antireflective coating material to prevent light from being reflected off the surface of the buried light shielding structures. Forming buried light shielding structures with antireflective coating material can reduce optical pixel crosstalk and enhance global shutter efficiency.

21 Claims, 5 Drawing Sheets

BACKSIDE ILLUMINATED IMAGE SENSOR PIXELS WITH DARK FIELD MICROLENSES

This application claims the benefit of provisional patent application No. 61/703,997, filed Sep. 21, 2012, which is hereby incorporated by reference herein in its entirety.

BACKGROUND

This relates generally to image sensors, and more specifically, to image sensors operable in global shutter mode.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

A dielectric stack is formed on the substrate over the photodiodes. The dielectric stack includes metal routing lines and metal vias formed in dielectric material. Light guides are often formed in the dielectric stack to guide the trajectory of incoming light. A color filter array is typically formed over the dielectric stack to provide each pixel with sensitivity to a certain range of wavelengths. Microlenses are formed over the color filter array. Light enters the microlenses and travels through the color filters into the dielectric stack.

In a conventional image sensor configured to operate in global shutter mode, each image sensor pixel includes a photodiode for detecting incoming light and a separate storage diode for temporarily storing charge. The storage diode should not be exposed to incoming light. In such arrangements, structures such as tungsten buried light shields (abbreviated as WBLS) are formed on the substrate between neighboring photodiodes to help prevent stray light from affecting the storage diode. At least some metal vias are formed through gaps in the buried light shields in order to control pixel transistors formed between two adjacent photodiodes. Shielding storage diodes in this way can help reduce crosstalk and increase global shutter efficiency (i.e., the buried light shields are designed to prevent stray light from entering regions of the substrate located between two adjacent photodiodes).

In practice, however, the tungsten buried light shield reflects stray light. The reflected stray light may then strike nearby metal routing structures and be scattered back towards the substrate, through the existing gaps in the buried light shield, and corrupt the storage diode. This results in undesirable pixel crosstalk and degraded global shutter efficiency.

It would therefore be desirable to be able to provide improved image sensors.

DETAILED DESCRIPTION

Embodiments of the present invention relate to image sensors, and more particularly, to backside illuminated image sensors with inner silicon microlenses. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
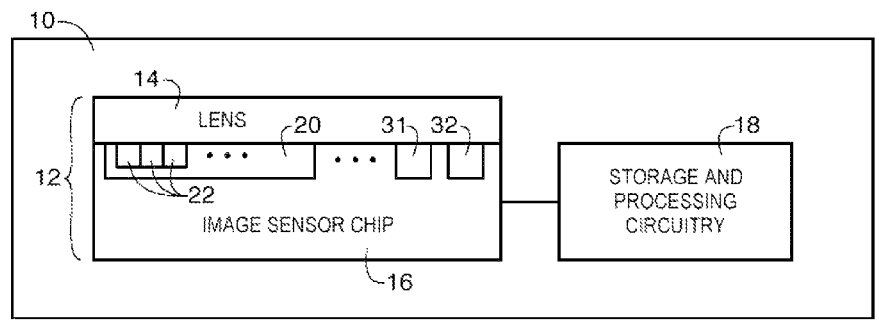
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Embodiments of the present invention relate to image sensor pixels configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
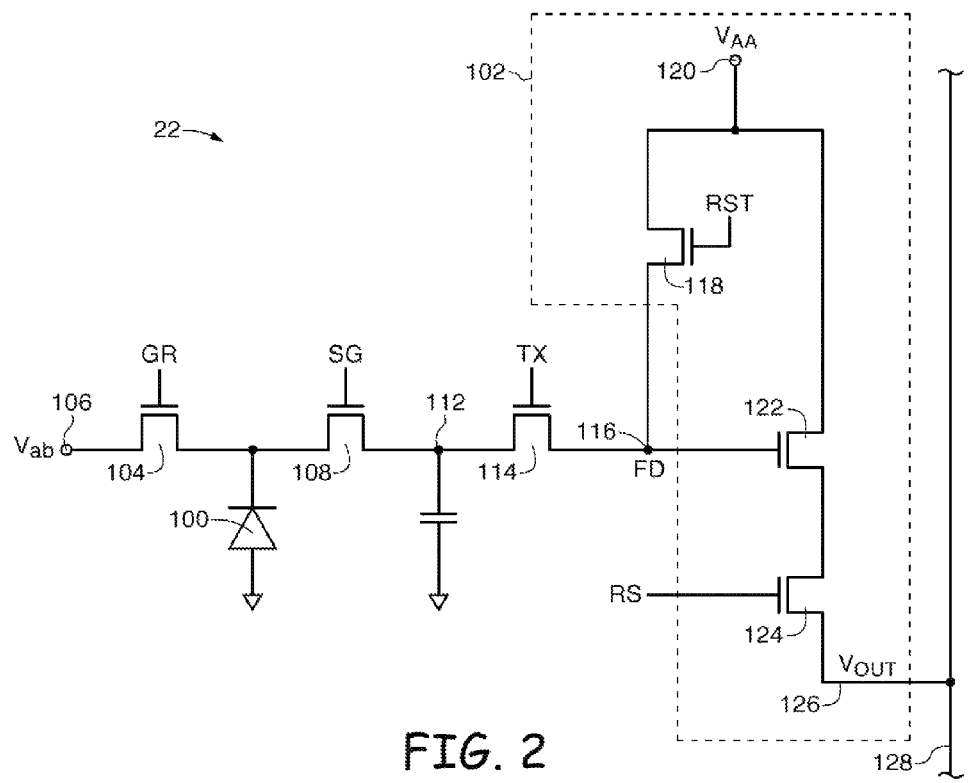
FIG. 2 is a diagram of an illustrative image sensor pixel that may be used to support global shutter operation in accordance with an embodiment of the present invention.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa may be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (or integration time).

Before an image is acquired, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GR may be pulsed high to reset photodiode 100 to power supply voltage Vab (e.g., by passing Vab to photodiode 100 through global reset transistor 104).

Pixel 22 may further include a storage transistor 108 operable to transfer charge from photodiode 100 to storage node (sometimes called a charge storage region or storage region) 112. Charge storage region 112 may be a doped semiconductor region (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a "storage diode" (SD).

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a floating diffusion region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g. an output signal having a magnitude that is proportional to the amount of charge at floating diffusion node 116), is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 124. Image data Vout may be fed to processing circuitry 18 for further processing. The circuitry of FIG. 2 is merely illustrative. If desired, pixel 22 may include other pixel circuitry.

Figure 3:
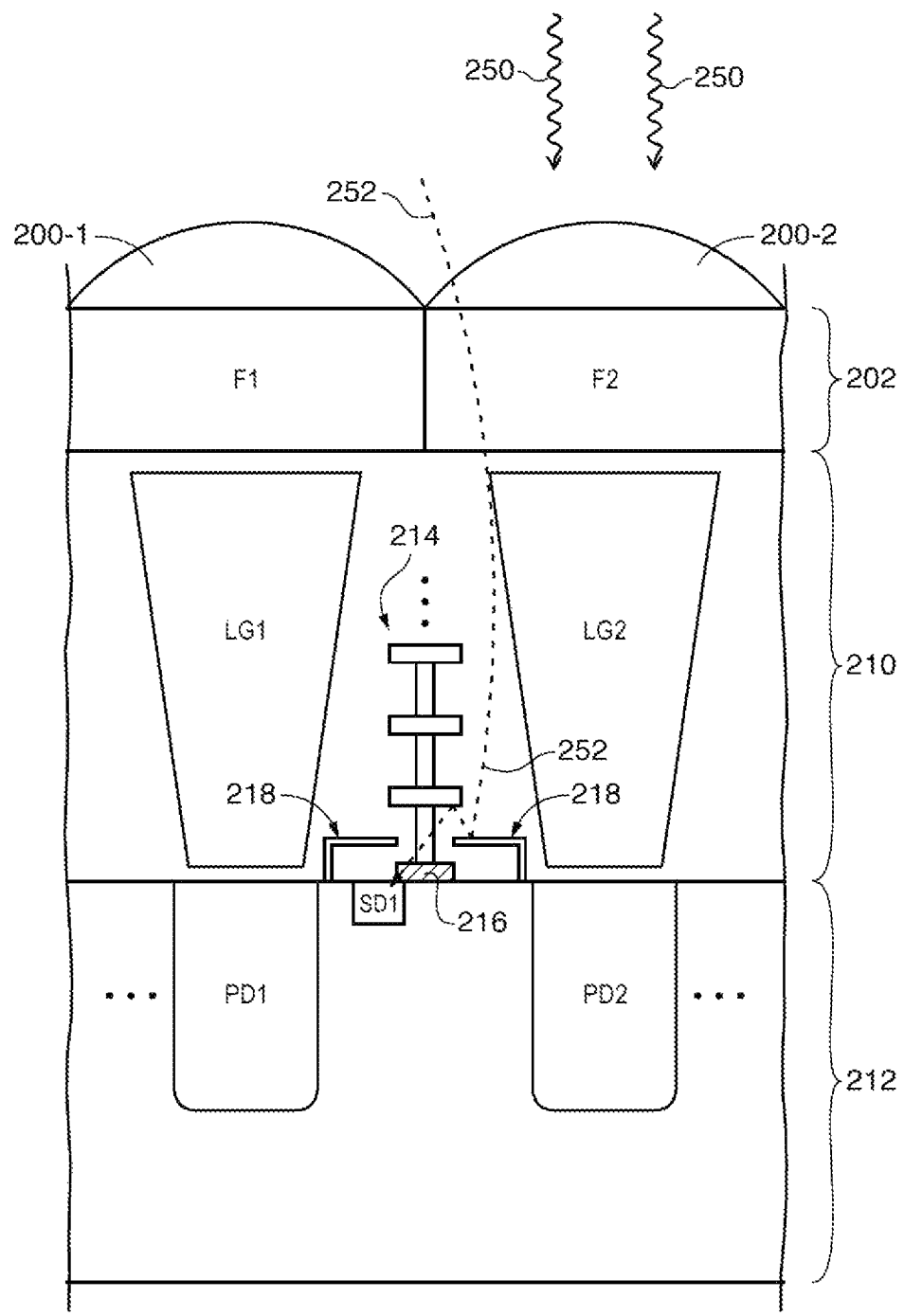
FIG. 3 is a cross-sectional side view of a conventional image sensor with reflective buried light shields.

FIG. 3 is a cross-sectional side view showing two adjacent conventional image sensor pixels operable in global shutter mode. As shown in FIG. 3, photodiode PD1 that is part of a first image sensor pixel and photodiode PD2 that is part of a second image sensor pixel are formed in a p-type substrate 212. Circuitry such as a storage diode SD1 and a storage gate conductor 216 (i.e., a gate conductor of the storage transistor) that is associated with the first image pixel may be formed on substrate 212 between photodiodes PD1 and PD2.

A dielectric stack 210 is formed on substrate 212. A first light guide LG1 for directing incoming light towards PD1 is formed above PD1 in dielectric stack 210. A second light guide LG2 for directing incoming light towards PD2 is formed above PD2 in dielectric stack 210. Metal interconnect routing paths 214 are formed in dielectric stack 210 between light guides LG1 and LG2. At least some metal routing path makes contact with storage gate conductor 216 for controlling the storage transistor.

A color filter array 202 is formed over dielectric stack 210. In particular, a first filter element F1 is formed on stack 210 directly above PD1, whereas a second filter element F2 is formed on stack 210 directly above PD2. First filter element F1 may be configured to pass green light, whereas second filter element F2 may be configured to pass red light. A first microlens 200-1 that is configured to focus light towards PD1 can be formed on first filter element F1, whereas a second microlens 200-2 that is configured to focus light towards PD2 can be formed on second filter element F2.

Ideally, incoming light 250 enters microlenses 200-1 and 200-2 from above and is directed towards the corresponding photodiodes. For example, light entering microlens 200-1 should be directed towards PD1, whereas light entering microlens 200-2 should be directed towards PD2. In practice, however, stray light may potentially strike regions on substrate 212 between adjacent photodiodes and result in undesired crosstalk and reduction in global shutter efficiency (i.e., stray light may undesirably affect the amount of charge in storage diode region SD1). Regions on substrate 212 where light should not be allowed to strike may be referred to as "dark" regions.

In an effort to prevent stray light from entering the dark regions, tungsten buried light shields 218 are formed to partially cover the dark regions (i.e., light shields 218 are designed to shield SD1 and storage gate 216). There may be gaps in the buried light shields through which interconnects 214 are formed to make contact with circuitry in the dark regions.

Tungsten buried light shields 218 are reflective. In practice, stray light may reflect off the tungsten buried light shields 218; the reflected light may strike nearby interconnect routing structures 214 and be scattered through the gaps in the light shields into the dark regions (as indicated by path 252). Even though the tungsten buried light shields help to reduce crosstalk, stray light can still be inadvertently scattered into the dark regions on substrate 212. It may therefore be desirable to provide image sensor pixels with improved crosstalk mitigation capabilities.

Figure 4:
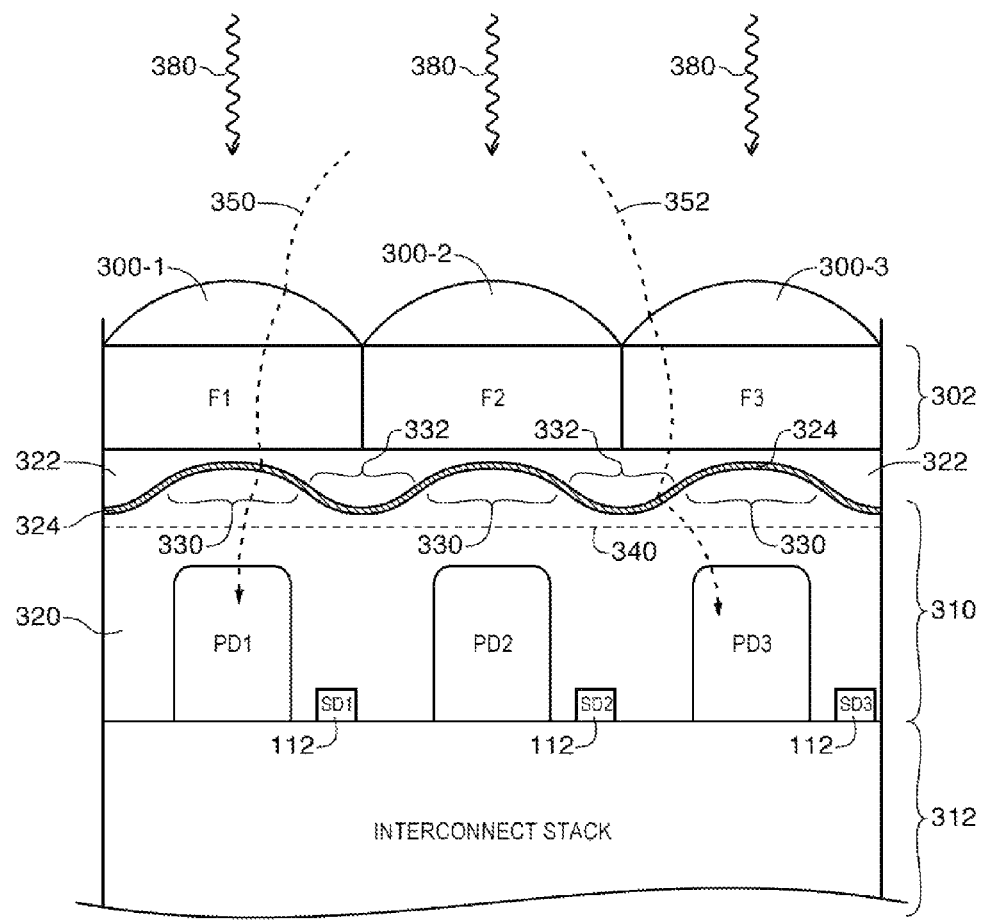
FIG. 4 is a cross-sectional side view of illustrative backside illuminated (BSI) image sensor pixels with silicon inner microlenses in accordance with an embodiment of the present invention.

In accordance with an embodiment of the present invention, image sensor pixels may be provided with inner silicon microlenses (see, e.g., FIG. 4). As shown in FIG. 4, photosensitive elements such as photodiode PD1 associated with a first image sensor pixel 22, photodiode PD2 associated with a second image sensor pixel 22, and photodiode PD3 associated with a third image sensor pixel 22 may be formed in a first (front) surface of semiconductor substrate 310 (e.g., a p-type silicon substrate). Storage diode regions (e.g., regions SD1, SD2, and SD3) and other pixel structures (e.g., floating diffusion region 116, transistors 104, 108, 114, 118, and 124, etc.) may also be formed in the front surface of substrate 310 in regions between adjacent or neighboring photodiodes.

A dielectric stack such as dielectric stack 312 may be formed on the front surface of substrate 310. Dielectric stack 312 may be formed from dielectric material such as silicon oxide. Interconnect routing structures such as conductive signal routing paths and conductive vias may be formed in dielectric stack 312 to contact the various pixel transistor terminals. Dielectric stack 312 may therefore sometimes be referred to as an interconnect stack.

A color filter array such as color filter array structure 302 may be formed on a second (back) surface of substrate 310. In the example of FIG. 4, a first color filter element F1 may be formed on the back surface of substrate 310 above PD1; a second color filter element F2 may be formed on the back surface of substrate 310 above PD2; and a third color filter element F3 may be formed on the back surface of substrate 310 above PD3. Filter element F1 may serve to pass light in a first portion of the visible spectrum; filter element F2 may serve to pass light in a second portion of the visible spectrum that is different than the first portion; and filter element F3 may serve to pass light in a third portion of the visible spectrum that is different than the first and second portions. In general, color filter elements F1, F2, and F3 may each be configured to pass through a selected one of: green light, red light, blue light, cyan light, magenta light, yellow light, and/or other types of light.

A microlens array may be formed on top of color filter array 302. The microlens array may include a first microlens 300-1 formed on top of first color filter element F1, a second microlens 300-2 formed on top of second color filter element F2, and a third microlens 300-3 formed on top of third color filter element F3. Microlenses 300 formed on top of color filter array 302 may be referred to as "outer" microlenses. Microlens 300-1 may be used to focus light towards PD1. Microlens 300-2 may be used to focus light towards PD2. Microlens 300-3 may be used to focus light towards PD3.

In the example of FIG. 4, incoming light 380 may enter substrate 310 from the back surface. Image sensor pixels operated in this way are therefore sometimes referred to as backside illuminated (BSI) image sensor pixels. In accordance with an embodiment of the present invention, an additional array of microlenses can be formed at the back surface of substrate 310. As shown in FIG. 4, a first group of microlenses 330 formed in the back surface of substrate 310 may each be horizontally aligned to a corresponding photodiode, whereas a second group of microlenses 332 formed in the back surface of substrate 310 may each be formed above a corresponding storage diode region.

Microlenses 330 that are contiguous with the p-type silicon substrate 310 can be used to further direct incoming light towards the photodiodes (as indicated by dotted path 350) and are therefore sometimes referred to as "inner" silicon microlenses (since microlenses 300 covering the color filter array 302 are sometimes referred to as outer microlenses), buried silicon microlenses, embedded silicon microlenses, and/or "positive" silicon microlenses (i.e., microlenses with positive radiuses of curvature). The outer microlenses 300 (e.g., microlenses 300-1, 300-2, and 300-3) and the inner positive silicon microlenses 330 may, for example, have the same radius of curvature (RoC).

Dielectric material such as silicon oxide 322 may be formed over microlenses 330. Oxide material 322 may therefore be formed between silicon substrate 310 and color filter array 302. A layer of BSI antireflective coating (ARC) material 324 may be formed at the interface between silicon substrate 310 and silicon oxide material 322. ARC liner 324 may serve to minimize reflections when the incoming light strikes the oxide-silicon interface (i.e., ARC liner 324 may exhibit a refractive index that is suitable for serving as an absorptive antireflective liner at the oxide-silicon interface).

A silicon inner microlens 332 may be formed between each pair of adjacent positive silicon microlenses 330. Regions on substrate 310 that should not be exposed to incoming light (i.e., regions between adjacent photodiodes in which storage diodes are formed) is sometimes referred to as "dark" regions or dark fields. Microlens 332 may also exhibit a negative radius of curvature relative to incoming light 380. Positive microlenses 330 and negative microlenses 332 may have the same radius of curvature or may have different radiuses of curvature. Microlenses 332 that are formed above the dark fields may therefore sometimes be referred to as dark field microlenses, buried/embedded negative silicon microlenses, etc. Microlenses 332 formed using this configuration may be used to further direct stray light that would otherwise inadvertently penetrate into the dark regions back towards the photodiodes (as indicated by dotted path 352). The use of negative inner silicon microlenses in this way can substantially reduce optical pixel crosstalk and improve global shutter efficiency.

The inner silicon microlenses may be manufactured using any suitable complementary metal-oxide-semiconductor (CMOS) fabrication techniques. As an example, the back surface of substrate 310 may be polished to a surface level 340 using chemical-mechanical planarization (CMP) techniques or other suitable machining methods. The desired shapes for positive and negative buried silicon microlenses 330 and 332 can then be formed by oxidizing Si through lens shaped masks or using other suitable shape transfer techniques. A layer of ARC material 324 can then be formed over the inner microlenses via sputtering, other types of physical vapor deposition, or other types of deposition techniques (e.g., chemical vapor deposition, electrochemical deposition, ink jet patterning, pad printing, spinning, spraying, etc.). Oxide material 322 can then be formed over ARC liner 324 to provide a planar surface on which color filter array 302 can then be formed.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The example of FIG. 4 in which the inner silicon microlenses 330 and 332 are formed over three adjacent photodiodes is merely illustrative and does not serve to limit the scope of the present invention. In general, the inner silicon microlenses 330 and 332 may be formed as part of any number of image sensor pixels 22 in image sensor array 20.

Figure 5:
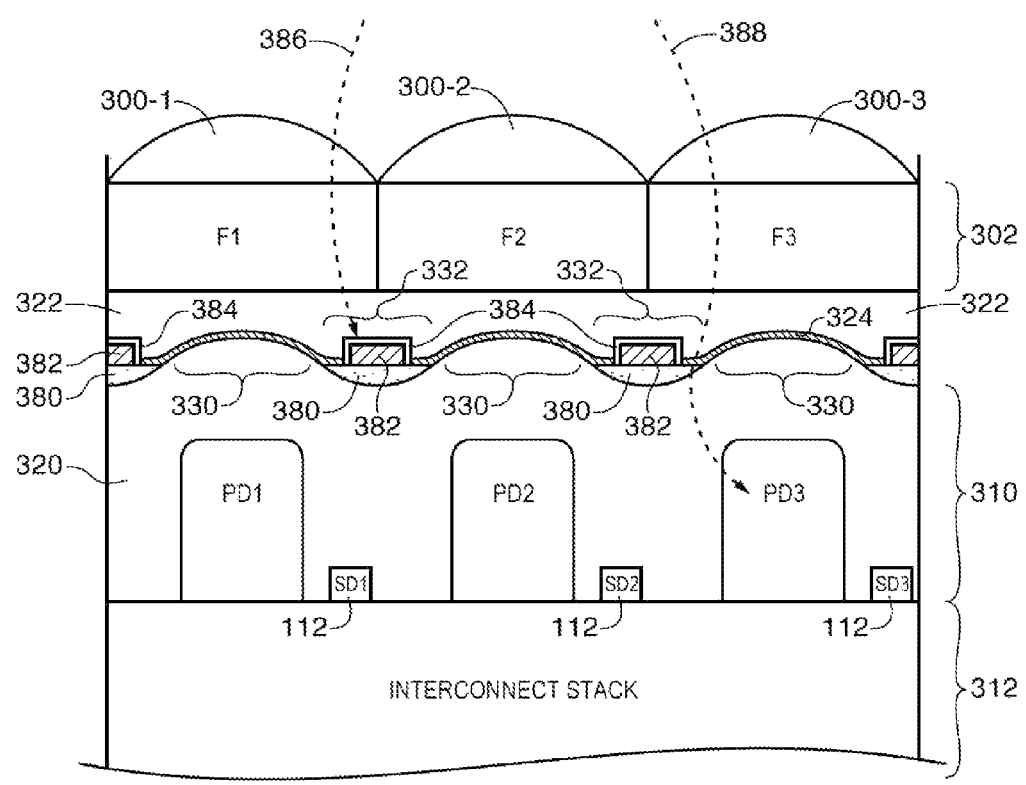
FIG. 5 is a cross-sectional side view of illustrative backside illuminated (BSI) image sensor pixels that include absorptive light shielding structures formed on top of silicon inner microlenses in accordance with an embodiment of the present invention.

FIG. 5 shows another suitable arrangement of the present invention in which shielding structures such as light shielding structures 382 are formed over the negative silicon inner microlenses 332. As shown in FIG. 5, microlens 332 may be at least partially filled using dielectric material such as silicon oxide material 380. A light shielding structure such as light shield structure 382 may be formed on top of oxide portion 380. Shielding structure 382 may be formed from tungsten, copper, gold, silver, aluminum, or other suitable conductive material. Shielding structures 382 that are formed using tungsten may sometimes be referred to as tungsten buried light shields (WBLS).

Shielding structure 382 may be opaque to light but may be reflective. To prevent potential reflections and undesired scattering of light which can further exacerbate optical pixel crosstalk, a layer of antireflective coating material 384 may be formed on light shield 382. For example, buried light shield structure 382 may be lined with a layer of titanium nitride (TiN) 384. Titanium nitride liner 384 may have an index of refraction having a real component n that is approximately equal to 2 and an imaginary component k that is equal to 1.3. Coating structure 382 with such type of ARC material can help absorb any stray light in the 400-650 nm wavelength range and prevent light in that range from reflecting off the surface of structure 382 (as indicated by light path 386). Liner 320 formed in this way can sometimes be referred to as an "absorptive" antireflective layer.

Buried light shielding structure 382 may not cover the entirety of silicon inner microlens 332. Stray light leaking into the uncovered portions of microlens 332 that would otherwise inadvertently penetrate into the dark regions, however, can still be redirected towards the desired photodiode using negative microlens 332 (as indicated by dotted path 388). The use of buried light shielding structures 382 lined with absorptive antireflective coating material 384 formed on top of oxide filled negative inner microlenses 332 can therefore substantially reduce optical pixel crosstalk and increase global shutter efficiency.

The example of using titanium nitride in ARC liner 384 is merely illustrative and does not serve to limit the scope of the present invention. Consider a scenario in which oxide material 322 is formed from a material with refractive index n1 and in which buried light shielding structure 382 is formed from a material with refractive index n2. In particular, ARC liner 384 may be any material having a refractive index that is between n1 and n2. For example, liner 384 may exhibit a refractive index that is equal to the geometric mean of n1 and n2. As another example, liner 384 may exhibit an index of refraction that is greater than n1 and less than n2. In general, the refractive index values vary as a function of wavelength. The choice of ARC material may therefore depend on the particular wavelength of light that should be attenuated.

As described above in connection with FIG. 4, antireflective material such as ARC liner 324 may also be formed over the photodiodes. ARC liner 324 formed at the interface between oxide material 322 and substrate 310 (formed from crystalline silicon) may generally be formed from different materials as that of ARC liner 384. If desired, liners 324 and 384 may be formed from the same material. Forming absorptive liners over the photodiodes and on top of the buried light shielding structures may help prevent light from being reflected off the surface of substrate 312 at undesired angles, thereby drastically reducing optical pixel crosstalk.

The embodiments described thus far relate to BSI image sensors operating in global shutter mode. If desired, the embodiments of the present invention can also be applied to image sensors operating in rolling shutter mode and to frontside illuminated (FSI) image sensors to help reduce optical pixel cross-talk.

Figure 6:
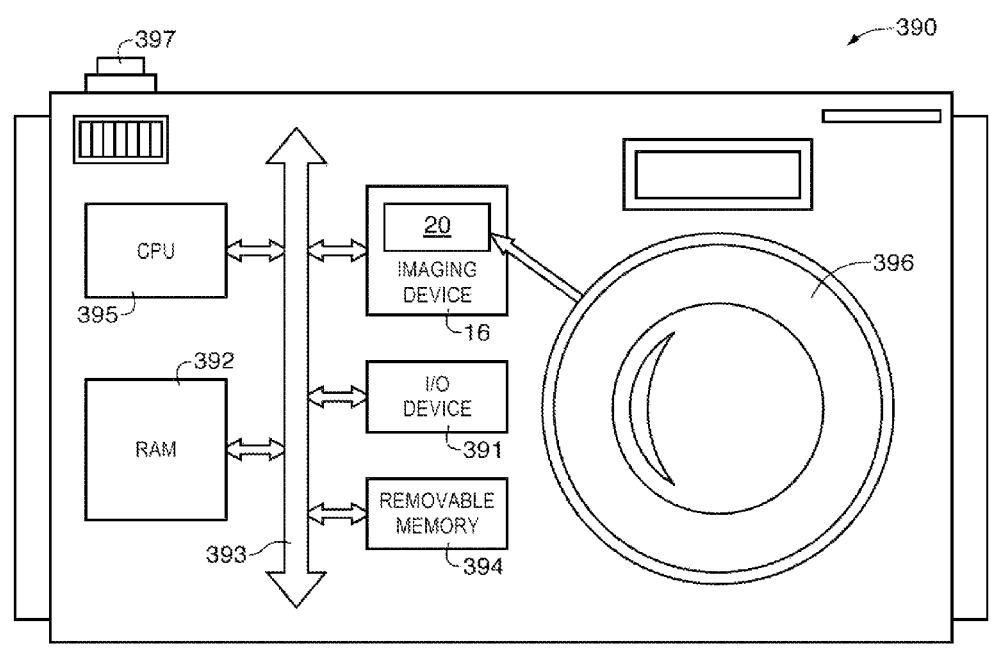
FIG. 6 is a block diagram of a processor system that may employ some of the embodiments of FIGS. 4 and 5 in accordance with an embodiment of the present invention.

FIG. 6 shows, in simplified form, a typical processor system 390. Processor system 390 is exemplary of a system having digital circuits that include imaging device 16 with the inner silicon microlenses of FIGS. 4 and 5. Without being limiting, such a system could include a computer system, still or video camera system, scanner, machine vision, vehicle navigation, video phone, surveillance system, auto focus system, star tracker system, motion detection system, image stabilization system, video gaming system, video overlay system, and other systems employing an imaging device.

Processor system 390, which may be a digital still or video camera system, may include a lens such as lens 396 for focusing an image onto a pixel array such as pixel array 20 when shutter release button 397 is pressed. Processor system 390 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 16 may also communicate with CPU 395 over bus 393. System 390 may include random access memory (RAM) 392 and removable memory 394. Removable memory 394 may include flash memory that communicates with CPU 395 over bus 393. Imaging device 16 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems with inner silicon microlenses having negative radiuses of curvature. A system may include a backside illuminate (BSI) image sensor module with an array of image sensor pixels and one or more lenses that focus light onto the array of image sensor pixels (e.g., image pixels arranged in rows and columns).

In particular, first and second neighboring photodiodes may be formed in a front surface of a semiconductor substrate. A first "positive" silicon inner microlens (i.e., a microlens having a positive radius of curvature) may be formed in a back surface of the substrate over the first photodiode, whereas a second positive silicon inner microlens may be formed in the back surface of the substrate over the first photodiode. A "negative" silicon inner microlens (i.e., a microlens having a negative radius of curvature) may be formed in the back surface of the substrate in a region between the first and second photodiodes.

In one suitable arrangement, a layer of absorptive antireflective coating material may be formed over the inner microlenses. In another suitable arrangement, dielectric filler material (e.g., silicon oxide) may be partially formed on top of the negative inner microlens. A light shielding structure such as a tungsten buried light shielding (WBLS) structure may be formed on the dielectric filler material. A layer of antireflective coating material may be selectively formed on the light shielding structure. Moreover, an antireflective liner may be formed directly on the first and second positive inner microlenses (but not over the light shielding structures). This antireflective liner and the antireflective coating material on the buried light shielding structure may be formed from different materials.

Inner silicon microlenses having negative radiuses of curvature and associated buried light shield structures lined with absorptive antireflective coating material formed in this way may be used to prevent pixel circuits such as storage diode regions formed in the substrate between adjacent photodiodes from being exposed to incoming (stray) light, thereby reducing optical pixel crosstalk and enhancing global shutter efficiency.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
a substrate;
first and second neighboring photodiodes formed in the substrate; and
an inner microlens formed in the substrate between the first and second photodiodes.

2. The image sensor defined in claim 1, further comprising:
a first outer microlens formed over the first photodiode; and
a second outer microlens formed over the second photodiode.

3. The image sensor defined in claim 1, further comprising:
dielectric filler material formed at least partially on the inner microlens; and
a light shielding structure formed on the dielectric filler material.

4. The image sensor defined in claim 2, further comprising:
a first additional inner microlens that is formed in the substrate and that is interposed between the first photodiode and the first outer microlens; and
a second additional inner microlens that is formed in the substrate and that is interposed between the second photodiode and the second outer microlens.

5. The image sensor defined in claim 4, wherein the first and second photodiodes are formed in a first surface of the substrate, and wherein the inner microlens is formed at a second surface of the substrate that is different than the first surface.

6. The image sensor defined in claim 4, further comprising:
a layer of absorptive antireflective coating material formed over the inner microlens and over the first and second additional inner microlenses.

7. The image sensor defined in claim 5, wherein the inner microlens has a negative radius of curvature, and wherein the first and second additional inner microlenses have positive radiuses of curvature.

8. The image sensor defined in claim 3, further comprising:
a layer of absorptive antireflective coating material formed on the light shielding structure.

9. A method of manufacturing an image sensor having a substrate, comprising:
forming first and second adjacent photodiodes in a front surface of the substrate;
forming a microlens having a negative radius of curvature in a back surface of the substrate between the first and second photodiodes.

10. The method defined in claim 9, further comprising:
forming a first additional microlens in the back surface of the substrate over the first photodiode; and
forming a second additional microlens in the back surface of the substrate over the second photodiode, wherein the first and second additional microlenses have positive radiuses of curvature.

11. The method defined in claim 10, further comprising:
forming first and second outer microlens over the first and second additional microlenses, respectively.

12. The method defined in claim 10, further comprising:
forming a layer of antireflective coating material over the microlens and over the first and second additional microlenses.

13. The method defined in claim 10, further comprising:
at least partially filling the microlens with dielectric material; and
forming a buried light shielding structure on the dielectric material.

14. The method defined in claim 13, further comprising:
selectively forming a layer of antireflective coating material on the buried light shielding structure.

15. The method defined in claim 14, further comprising:
forming an antireflective liner directly on the first and second additional microlenses, wherein the antireflective liner and the antireflective coating material on the buried light shielding structure are formed from different materials.

16. A system, comprising:
a central processing unit;
memory;
a lens;
input-output circuitry; and
an imaging device having a backside illuminated (BSI) image sensor that includes:
a substrate having a front surface and a back surface;
first and second adjacent photodiodes formed in the front surface of the substrate;
a first positive silicon microlens formed in the back surface of the substrate over the first photodiode;
a second positive silicon microlens formed in the back surface of the substrate over the second photodiode; and
a negative silicon microlens formed in the back surface of the substrate in a region between the first and second photodiodes, wherein the first and second positive silicon microlenses have positive radiuses of curvature, and wherein the negative silicon microlens has a negative radius of curvature.

17. The system defined in claim 16, wherein the radiuses of curvature of the first and second positive silicon microlenses and the negative silicon microlens are equal.

18. The system defined in claim 16, wherein the image sensor further includes:
a layer of absorptive antireflective coating material formed over the negative silicon microlens and over the first and second positive silicon microlenses.

19. The system defined in claim 16, wherein the image sensor further includes:
oxide material formed at least partially on the negative silicon microlens; and
a light shielding structure formed on the oxide material.

20. The system defined in claim 16, wherein the image sensor further includes:
an absorptive antireflective liner formed on the light shielding structure.

21. The system defined in claim 20, wherein the light shielding structure is formed from tungsten, and wherein the absorptive antireflective liner is formed from titanium nitride.

* * * * *